US012230673B2

(12) United States Patent
Abou-Khalil et al.

(10) Patent No.: US 12,230,673 B2
(45) Date of Patent: Feb. 18, 2025

(54) FIELD-EFFECT TRANSISTORS HAVING A GATE ELECTRODE POSITIONED INSIDE A SUBSTRATE RECESS

(71) Applicant: GlobalFoundries U.S. Inc., Malta, NY (US)

(72) Inventors: Michel Abou-Khalil, Essex Junction, VT (US); Steven M. Shank, Jericho, VT (US); Aaron Vallett, Jericho, VT (US); Sarah McTaggart, Essex Junction, VT (US); Rajendran Krishnasamy, Essex Junction, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 328 days.

(21) Appl. No.: 17/708,561

(22) Filed: Mar. 30, 2022

(65) Prior Publication Data

US 2023/0317776 A1 Oct. 5, 2023

(51) Int. Cl.
*H01L 29/06* (2006.01)
*H01L 29/10* (2006.01)
*H01L 29/423* (2006.01)

(52) U.S. Cl.
CPC ...... *H01L 29/0649* (2013.01); *H01L 29/1087* (2013.01); *H01L 29/4236* (2013.01)

(58) Field of Classification Search
CPC ............. H01L 29/0649; H01L 29/1087; H01L 29/4236
USPC .......................................................... 257/330
See application file for complete search history.

(56) References Cited

U.S. PATENT DOCUMENTS 6,528,847 B2 3/2003 Liu
7,947,543 B2 5/2011 Kim
10,192,779 B1 1/2019 Shank et al.
11,158,535 B2 10/2021 Shank et al.
2009/0001458 A1 * 1/2009 Chung .............. H01L 29/42376 257/E21.429
2012/0261720 A1 10/2012 Puglisi et al.
2015/0001622 A1 1/2015 Abou-Khalil et al.
2021/0066118 A1 3/2021 Abou-Khalil et al.

OTHER PUBLICATIONS

European Patent Office, Extended European Search Report and Written Opinion issued in European Patent Application No. 22198020.4 on Jun. 12, 2023 (8 pages).

* cited by examiner

*Primary Examiner* — Monica D Harrison
(74) *Attorney, Agent, or Firm* — Thompson Hine LLP; Francois Pagette

(57) ABSTRACT

Semiconductor structures including electrical isolation and methods of forming a semiconductor structure including electrical isolation. The structure includes a semiconductor substrate having a first surface, a recess in the first surface, and a second surface inside the first recess. The structure further includes a shallow trench isolation region extending from the first surface into the semiconductor substrate. The shallow trench isolation region is positioned to surround an active device region including the recess. A field-effect transistor includes a gate electrode positioned on a portion of the second surface.

20 Claims, 4 Drawing Sheets

15
30
12
34
32
T2
T1
36
36
14
16
10

FIELD-EFFECT TRANSISTORS HAVING A GATE ELECTRODE POSITIONED INSIDE A SUBSTRATE RECESS

BACKGROUND

The disclosure relates to semiconductor device fabrication and integrated circuits and, more specifically, to structures for a field-effect transistor and methods of forming a structure for a field-effect transistor.

Complementary-metal-oxide-semiconductor (CMOS) processes may be employed to build field-effect transistors that are used to construct, for example, a switch in a radio-frequency integrated circuit. A field-effect transistor generally includes a source, a drain, a semiconductor body supplying a channel region between the source and drain, and a gate electrode overlapped with the channel region. When a control voltage exceeding a characteristic threshold voltage is applied to the gate electrode, carrier flow occurs in the channel region between the source and drain to produce a device output current. Conventional field-effect transistors may exhibit an undesirably high value of off-capacitance, which may be detrimental to device performance.

Improved structures for a field-effect transistor and methods of forming a structure for a field-effect transistor are needed.

SUMMARY

In an embodiment of the invention, a structure comprises a semiconductor substrate including a first surface, a recess in the first surface, and a second surface inside the first recess. The structure further comprises a shallow trench isolation region extending from the first surface into the semiconductor substrate. The shallow trench isolation region is positioned to surround an active device region including the recess. A field-effect transistor includes a gate electrode positioned on a portion of the second surface.

In an embodiment of the invention, a method comprises forming a recess in a first surface of a semiconductor substrate. The semiconductor substrate includes a second surface inside the recess. The method further comprises forming a shallow trench isolation region extending from the first surface into the semiconductor substrate. The shallow trench isolation region is positioned to surround an active device region including the recess. The method further comprises forming a field-effect transistor including a gate electrode positioned on a portion of the second surface.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
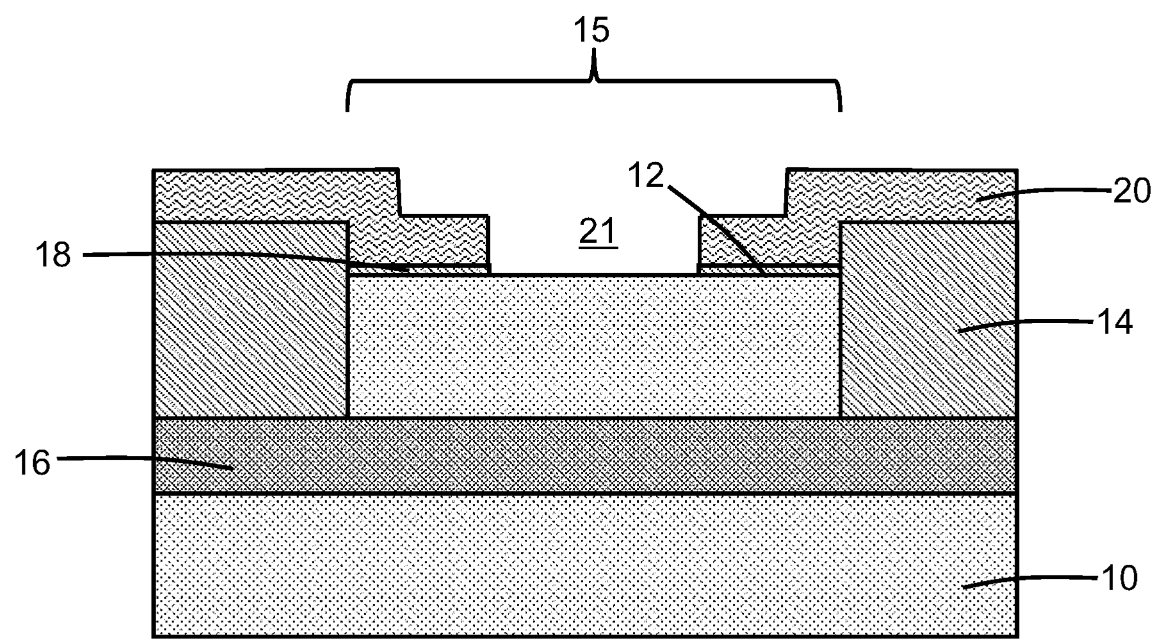
FIGS. 1-4 are cross-sectional views of a semiconductor structure at successive fabrication stages of a processing method in accordance with embodiments of the invention.

With reference to FIG. 1 and in accordance with embodiments of the invention, a semiconductor substrate 10 is provided that contains a semiconductor material, such as single-crystal silicon. A shallow trench isolation region 14 may be formed by a shallow trench isolation technique that patterns trenches in the semiconductor substrate 10 with lithography and etching processes, deposits a dielectric material to overfill the trenches, and planarizes the dielectric material using chemical mechanical polishing and/or an etch back to remove excess dielectric material over a top surface 12 of the semiconductor substrate 10. The dielectric material contained in the shallow trench isolation region 14 may be comprised of an electrical insulator, such as silicon dioxide, deposited by chemical vapor deposition. The shallow trench isolation region 14 surrounds an active device region 15 of the semiconductor substrate 10 in which a device structure may be subsequently fabricated.

A high-resistivity layer 16 is positioned in the semiconductor substrate 10 beneath the active device region 15. The electrical resistivity of the high-resistivity layer 16 is significantly greater than the electrical resistivity of the semiconductor substrate 10 in the active device region 15 or the bulk portion of the semiconductor substrate 10 that surrounds the active device region 15. For example, the high-resistivity layer 16 may be comprised of a polycrystalline semiconductor material, such as polysilicon, formed in the semiconductor substrate 10 by an amorphizing ion implantation and a subsequent anneal that recrystallizes the amorphous semiconductor material of the semiconductor substrate 10. The high-resistivity layer 16 may abut the shallow trench isolation region 14 and, in particular, the high-resistivity layer 16 may abut a lowermost portion of the shallow trench isolation region 14 such that the active device region 15 is fully isolated from the bulk portion of the semiconductor substrate 10, which may improve device performance for a device structure subsequently fabricated in the active device region 15.

Dielectric layers 18, 20 may be formed and patterned by lithography and etching processes to define an opening 21 that extends to a portion of the top surface 12 of the semiconductor substrate 10 in the active device region 15. The dielectric layer 18 may be comprised of a dielectric material, such as silicon dioxide, grown by thermal oxidation. The dielectric layer 20 may be comprised of a dielectric material, such as silicon nitride, deposited by chemical vapor deposition. In an embodiment, the opening 21 in the dielectric layers 18, 20 may be arranged over a centrally-located area of the top surface 12 of the semiconductor substrate 10 in the active device region 15.

Figure 2:
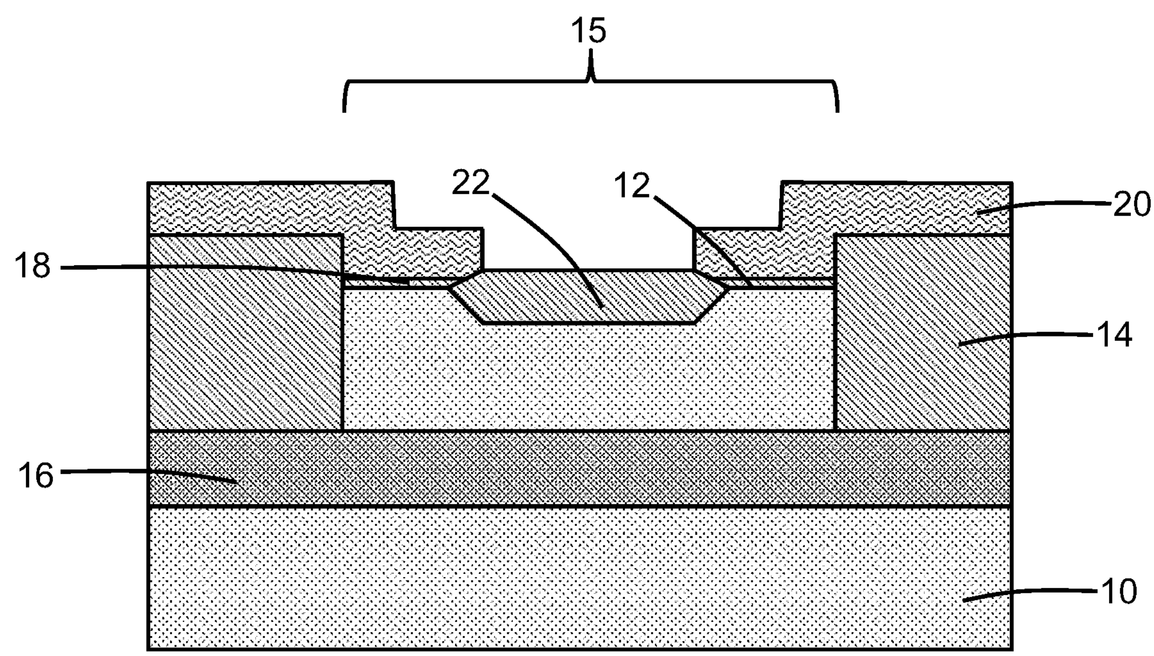

With reference to FIG. 2 in which like reference numerals refer to like features in FIG. 1 and at a subsequent fabrication stage, a dielectric layer 22 is formed at the location of the opening 21 in the dielectric layers 18, 20. The dielectric layer 22 may be comprised of a dielectric material, such as silicon dioxide. In an embodiment, the dielectric layer 22 may be comprised of silicon dioxide formed by subjecting the portion of the semiconductor substrate 10 at the location of the opening 21 to thermal oxidation in an oxidizing atmosphere (e.g., an atmosphere with an oxygen content) using a local oxidation of silicon (LOCOS) process. The oxidizing species (e.g., oxygen) is barred from diffusing through the thickness of the dielectric layer 20 during thermal oxidation, and the opening 21 in the dielectric layer 20 exposes an unprotected portion of the semiconductor substrate 10 that is thermally oxidized to grow the dielectric layer 22. The oxidizing species laterally diffuses in the semiconductor substrate 10 beneath the dielectric layer 20 at the side edges of the opening 21 and oxidizes the semiconductor material under the side edges. Because of the gradient inherent in the lateral diffusion of the oxidizing species, the dielectric layer 22 tapers from a full thickness interior of the side edges of the opening 21 to a near-zero thickness beneath the dielectric layer 20, and the dielectric layer 22 is faceted adjacent to the side edges of the opening 21 in the dielectric layer 20. Although not shown, the formation of the dielectric layer 22 may cause the dielectric layer 20 proximate to the side edges of the opening 21 to be deflected upwardly.

Figure 3:
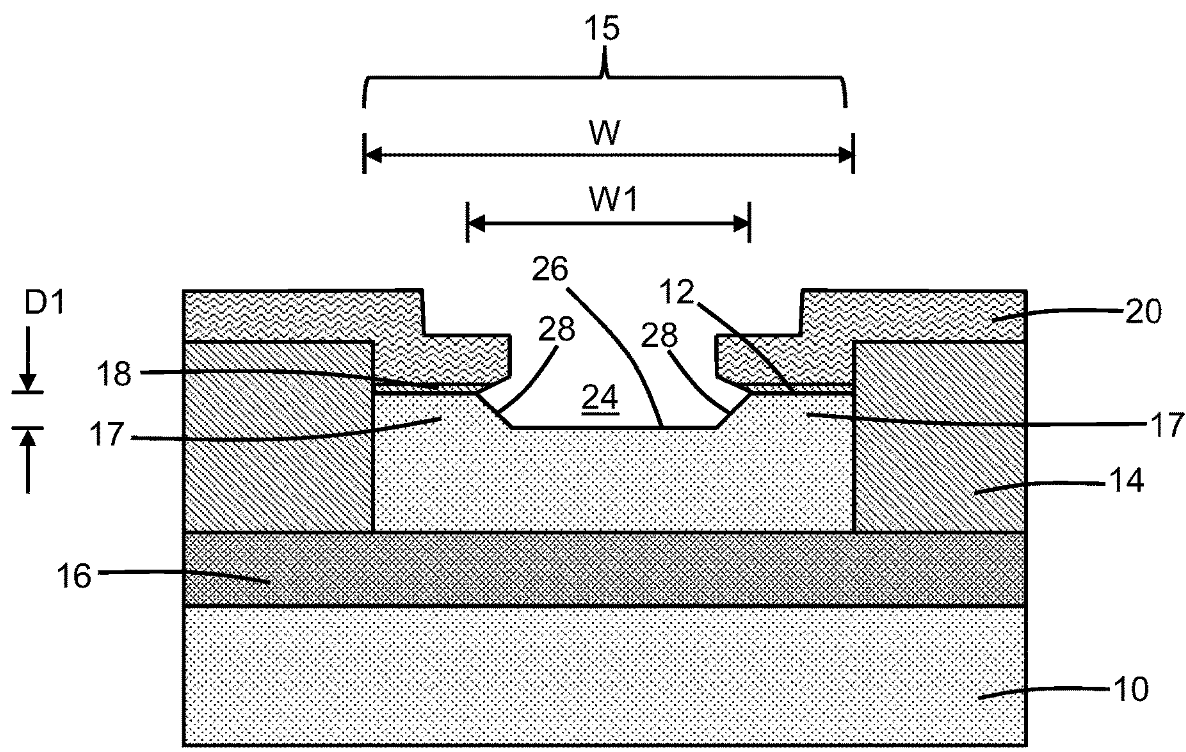

With reference to FIG. 3 in which like reference numerals refer to like features in FIG. 2 and at a subsequent fabrication stage, the dielectric layers 18, 20 and the dielectric layer 22 are removed by one or more etching processes. The removal of the dielectric layer 22 generates a faceted recess 24 in the top surface 12 of the semiconductor substrate 10. The shape and dimensions of the faceted recess 24 are defined by the shape and dimensions of the removed dielectric layer 22. The shallow trench isolation region 14 is positioned to surround the portion of the active device region 15 including the faceted recess 24.

The semiconductor substrate 10 includes a surface 26 inside the faceted recess 24 that is recessed relative to the top surface 12 and inclined surfaces 28 that join the surface 26 to the top surface 12 at the opposite side edges of the faceted recess 24. The inclined surfaces 28 are oriented at an angle relative to the top surface 12 and at an angle relative to the surface 26 due to the faceted shape of the removed dielectric layer 22. The faceted recess 24 penetrates partially through the semiconductor substrate 10 in the active device region 15 such that the surface 26 is located at a depth D1 that may be equal to the distance in a vertical direction between the top surface 12 and the surface 26 inside the faceted recess 24.

The faceted recess 24 has a width W1 that is less than the full width W of the active device region 15. As a result, the semiconductor substrate 10 in the active device region 15 includes raised portions 17 that are not recessed, and the faceted recess 24 is laterally positioned between the raised portions 17. The raised portions 17 of the semiconductor substrate 10 are effectively raised in elevation relative to the surface 26 inside the faceted recess 24, and the raised portions 17 are laterally positioned between the faceted recess 24 and the shallow trench isolation region 14.

Figure 4:
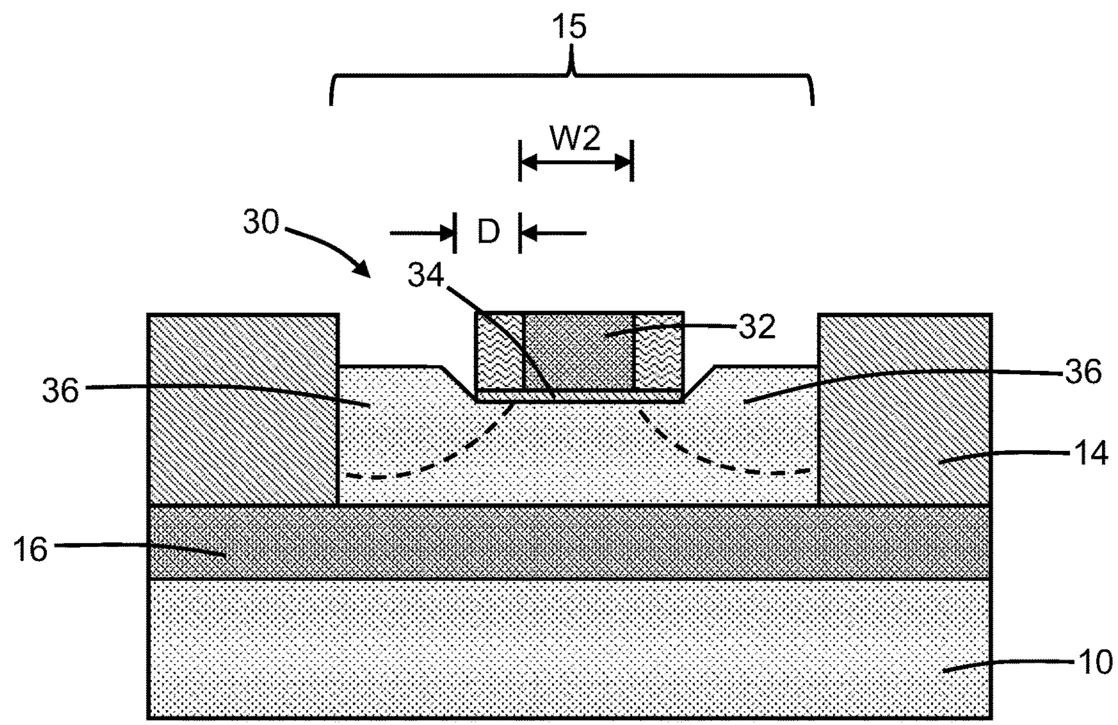

With reference to FIG. 4 in which like reference numerals refer to like features in FIG. 3 and at a subsequent fabrication stage, a field-effect transistor 30 may be fabricated by front-end-of-line (FEOL) processing as a device structure in the active device region 15 of the semiconductor substrate 10. The field-effect transistor 30 may include a gate electrode 32 and a gate dielectric layer 34 formed on the surface 26 by depositing a layer stack and patterning the layer stack with photolithography and etching processes. The gate electrode 32 may be comprised of a conductor, such as doped polycrystalline silicon (i.e., polysilicon) or a work function metal, and the gate dielectric layer 34 may be comprised of an electrical insulator, such as silicon dioxide or hafnium oxide. The field-effect transistor 30 may include other elements such as halo regions, lightly doped drain extensions, source/drain regions 36, and sidewall spacers on the gate electrode 32.

The source/drain regions 36 may be formed by, for example, ion implantation in the raised portions 17 (FIG. 3) of the semiconductor substrate 10. The source/drain regions 36 may be doped (e.g., heavily doped) with a concentration of a dopant, such as an n-type dopant (e.g., arsenic or phosphorus) that provides n-type conductivity. Alternatively, source/drain regions 36 may be doped (e.g., heavily doped) with a concentration of a p-type dopant (e.g., boron) that provides p-type conductivity. As used herein, the term "source/drain region" means a doped region of semiconductor material that can function as either a source or a drain of a field-effect transistor.

The gate electrode 32 and the gate dielectric layer 34 are positioned on the surface 26 inside the faceted recess 24. The gate electrode 32 is laterally offset in an inward direction from each of the inclined surfaces 28 bordering the faceted recess 24. In that regard, the gate electrode 32 has a width W2 that is less than the width W1 of the faceted recess 24 and, in particular, the gate electrode 32 has a width W2 that is less than the contribution of the width of the surface 26 to the width W1 of the faceted recess 24. In an embodiment, the gate electrode 32 may be centered between the raised portions 17 and inclined surfaces 28. In an embodiment, the gate dielectric layer 34 may be positioned on the entirety of the surface 26, including the portion of the surface 26 on which the gate electrode 32 is disposed.

Performance metrics characterizing the field-effect transistor 30 may be improved due to the introduction of the faceted recess 24. For example, arranging the gate electrode 32 of the field-effect transistor 30 inside the faceted recess 24 may operate to reduce the off-capacitance of the field-effect transistor 30.

Figure 5:
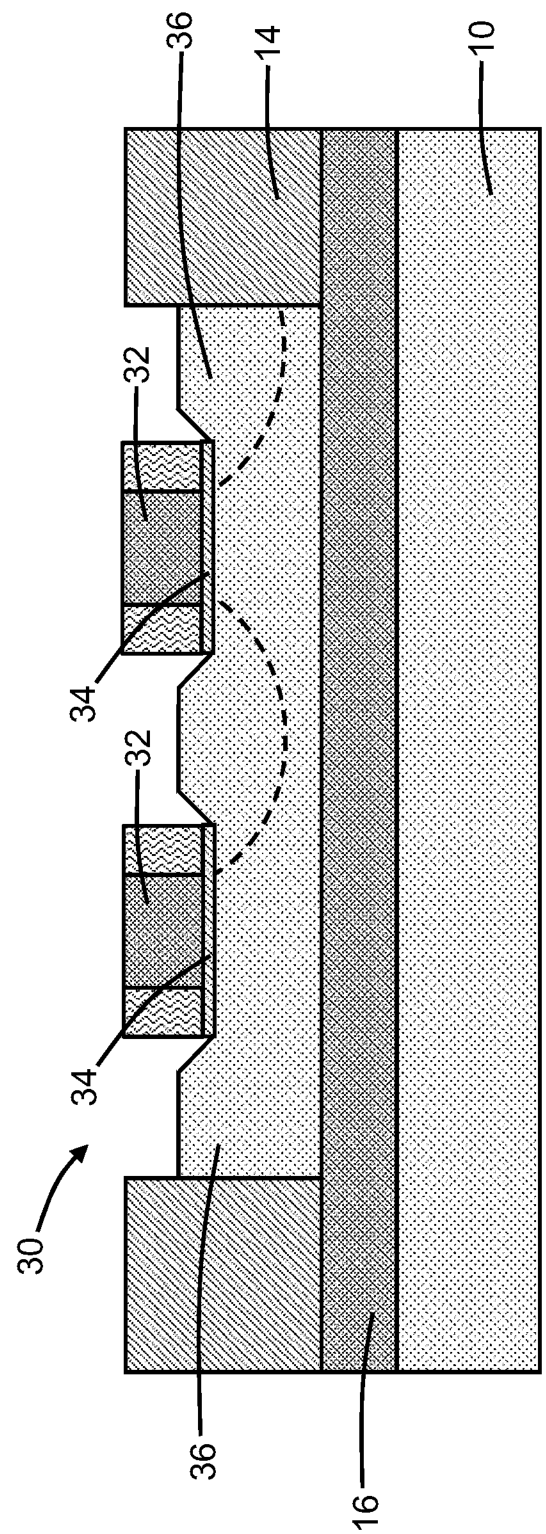
FIG. 5 is a cross-sectional view of a semiconductor structure in accordance with alternative embodiments of the invention.

With reference to FIG. 5 and in accordance with alternative embodiments of the invention, the field-effect transistor 30 may include multiple gate electrodes 32 to provide a switch field-effect transistor, which may be deployed in a radio-frequency front-end integrated circuit. The gate electrodes 32 are arranged as multiple parallel gate fingers each positioned inside its own faceted recess 24, and the gate electrodes 32 may be joined together at one end to provide a common connection for biasing.

Figure 6:
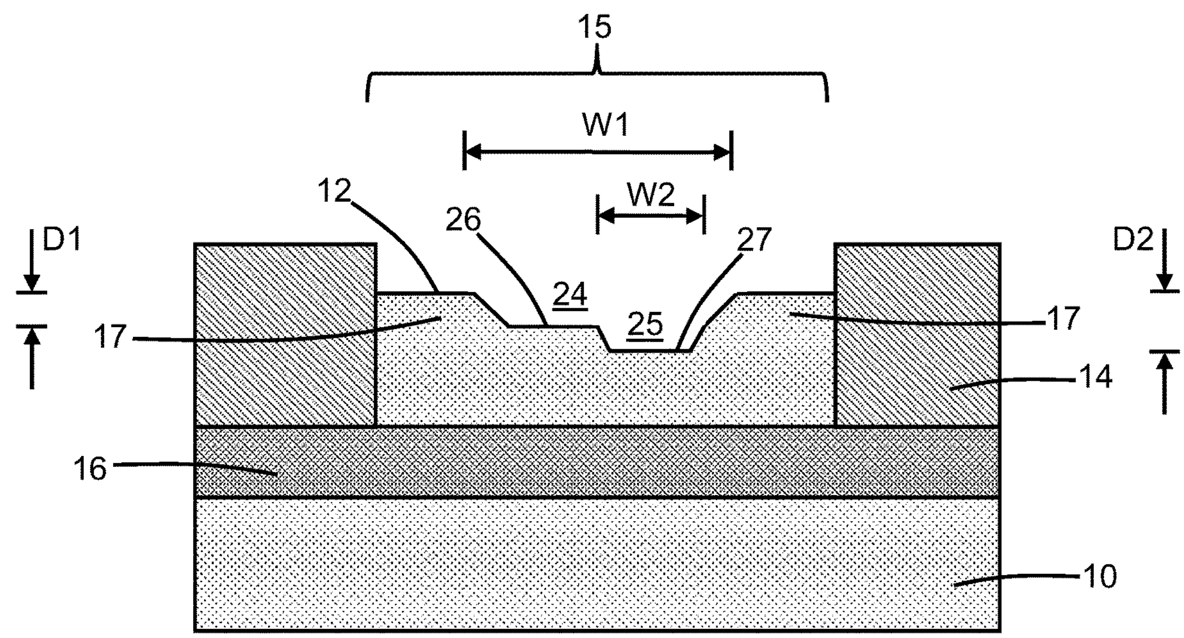
FIGS. 6-7 are cross-sectional views of a semiconductor structure at successive fabrication stages of a processing method in accordance with alternative embodiments of the invention.

With reference to FIG. 6 and in accordance with alternative embodiments of the invention, a faceted recess 25 may be formed in the surface 26 and within the faceted recess 24. The faceted recess 25 may be formed in the same manner as the faceted recess 24. The faceted recess 25 penetrates to a surface 27 of the semiconductor substrate 10 located at a depth D2 relative to the top surface 12 that is greater than the depth D1. The faceted recess 25 is laterally offset relative to the faceted recess 24, and the faceted recess 25 has a width W3 that is less than the width W1 of the faceted recess 24. The faceted recesses 24, 25 define a dual-depth composite recess that is recessed relative to the top surface 12 of the semiconductor substrate 10.

Figure 7:
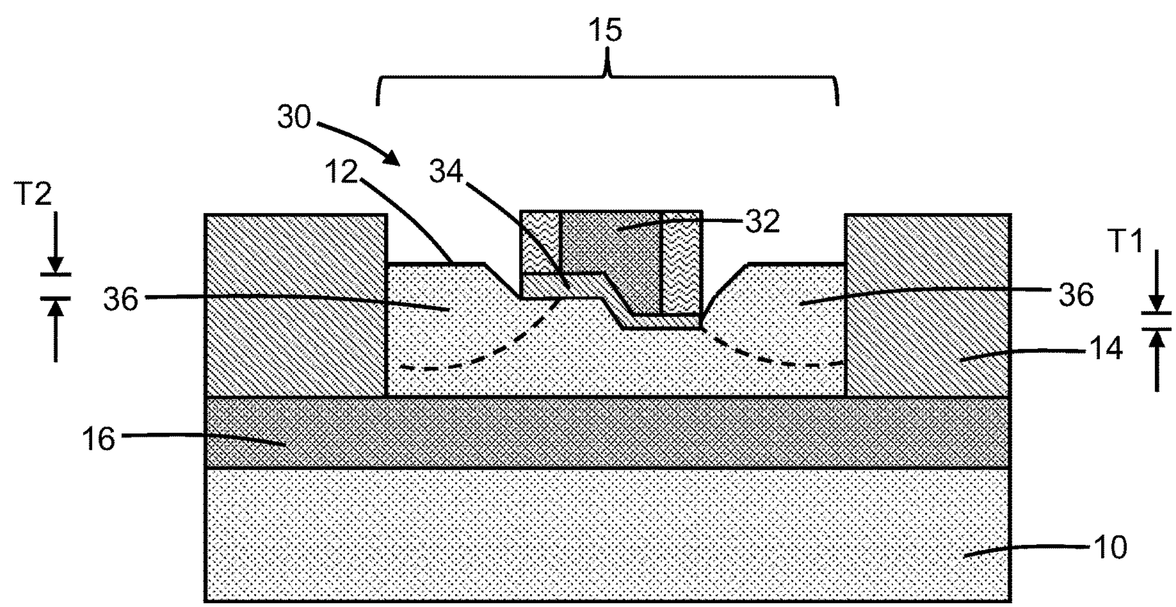

With reference to FIG. 7 in which like reference numerals refer to like features in FIG. 6 and at a subsequent fabrication stage of the processing method, a multiple-thickness gate dielectric layer 34 may be formed inside the faceted recesses 24, 25. A section of the gate dielectric layer 34, which may be formed on the surface 26, has a thickness T1, and another section of the gate dielectric layer 34, which may be formed on the surface 27, has a thickness T2 that is greater than the thickness T1. In an embodiment, the dual-thickness gate dielectric layer 34 may be formed by depositing a first dielectric layer with the thickness T1 inside both faceted recesses 24, 25, masking the first dielectric layer on the surface 27, and removing non-masked portions of the first dielectric layer with an etching processes, followed by depositing a second dielectric layer with the thickness T2 inside both faceted recesses 24, 25, masking the second dielectric layer on the surface 26, and removing non-masked portions of the second dielectric layer with an etching processes.

The field-effect transistor 30 is subsequently fabricated as a device structure in the active device region 15 of the semiconductor substrate 10. The gate electrode 32 of the field-effect transistor 30, which is positioned on the gate dielectric layer 34 over the surfaces 26, 27, has dual thicknesses due to the difference in elevation and thickness of the different portions of the multiple-thickness gate dielectric layer 34. Specifically, the portion of the gate electrode 32 positioned on the section of the gate dielectric layer 34 with thickness T2 is thinner than the portion of the gate electrode 32 positioned on the section of the gate dielectric layer 34 with thickness T1.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:

a semiconductor substrate including a first surface, a first recess in the first surface, and a second surface inside the first recess;

a shallow trench isolation region extending from the first surface into the semiconductor substrate, the shallow trench isolation region positioned to surround an active device region including the first recess; and a field-effect transistor including a gate electrode positioned on a portion of the second surface and a gate dielectric layer on the second surface, the gate dielectric layer positioned between the gate electrode and the portion of the second surface, and the gate dielectric layer including a first section with a first thickness and a second section with a second thickness that is greater than the first thickness.

2. The structure of claim 1 wherein the gate electrode includes a first portion having a first thickness on the first section of the gate dielectric layer and a second portion having a second thickness on the second section of the gate dielectric layer that is less than the first thickness.

3. The structure of claim 1 wherein the semiconductor substrate includes a second recess in the second surface, and the first section of the gate dielectric layer is positioned in the second recess.

4. The structure of claim 1 wherein the field-effect transistor includes a source/drain region laterally positioned in the semiconductor substrate between the first recess and the shallow trench isolation region.

5. The structure of claim 1 wherein the semiconductor substrate includes a third surface inside the first recess, the third surface inclined at a first angle from the second surface to the first surface of the semiconductor substrate, and the gate electrode is laterally offset from the third surface.

6. The structure of claim 5 wherein the semiconductor substrate includes a fourth surface inside the first recess, the second surface is positioned between the third surface and the fourth surface, the fourth surface inclined at a second angle from the second surface to the first surface of the semiconductor substrate, and the gate electrode is laterally offset from the fourth surface.

7. The structure of claim 6 wherein the gate electrode is laterally positioned between the third surface and the fourth surface.

8. The structure of claim 1 wherein the first recess has a first width, and the gate electrode has a second width that is less than the first width.

9. The structure of claim 8 wherein the active device region has a third width, and the first width of the first recess is less than the third width.

10. The structure of claim 1 wherein the first recess has a first width, the active device region has a second width, and the first width of the first recess is less than the second width.

11. A structure comprising:

a semiconductor substrate including a first surface, a recess in the first surface, and a second surface inside the recess;

a shallow trench isolation region extending from the first surface into the semiconductor substrate, the shallow trench isolation region positioned to surround an active device region including the recess;

a field-effect transistor including a gate electrode positioned on a portion of the second surface; and a polycrystalline layer in the semiconductor substrate, the polycrystalline layer positioned beneath the active device region and the recess.

12. The structure of claim 11 wherein the polycrystalline layer abuts the shallow trench isolation region.

13. The structure of claim 11 wherein the semiconductor substrate includes a third surface inside the recess, the third surface inclined at a first angle from the second surface to the first surface of the semiconductor substrate, and the gate electrode is laterally offset from the third surface.

14. The structure of claim 13 wherein the semiconductor substrate includes a fourth surface inside the recess, the second surface is positioned between the third surface and the fourth surface, the fourth surface inclined at a second angle from the second surface to the first surface of the semiconductor substrate, and the gate electrode is laterally offset from the fourth surface.

15. The structure of claim 14 wherein the gate electrode is laterally positioned between the third surface and the fourth surface.

16. A method comprising:

forming a first dielectric layer on a first surface of a semiconductor substrate;

patterning the first dielectric layer to form an opening extending to the first surface;

oxidizing the semiconductor substrate at a location of the opening to form a second dielectric layer that is faceted;

removing the second dielectric layer to form a first recess in the first surface of the semiconductor substrate, wherein the semiconductor substrate includes a second surface inside the first recess;

forming a shallow trench isolation region extending from the first surface into the semiconductor substrate, wherein the shallow trench isolation region is positioned to surround an active device region including the first recess; and forming a field-effect transistor including a gate electrode positioned on a portion of the second surface.

17. The method of claim 16 wherein the field-effect transistor includes a gate dielectric layer formed between the gate electrode and the portion of the second surface.

18. The method of claim 17 wherein the gate dielectric layer includes a first section with a first thickness and a second section with a second thickness that is greater than the first thickness.

19. The method of claim 18 further comprising:

forming a second recess in the second surface, wherein the first section of the gate dielectric layer is positioned in the second recess.

20. The method of claim 18 wherein the first recess has a first width, the gate electrode has a second width that is less than the first width, the active device region has a third width, and the first width of the first recess is less than the third width.

* * * * *